(12) United States Patent
Gao (10) Patent No.: US 11,445,641 B1
(45) Date of Patent: Sep. 13, 2022

(54) ADVANCED FLUID CONNECTION DESIGN FOR MULTIPLE PHASE SYSTEM

(71) Applicant: BAIDU USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/182,564

(22) Filed: Feb. 23, 2021

(51) Int. Cl.
*H05K 7/20* (2006.01)

(52) U.S. Cl.
CPC ..... *H05K 7/20818* (2013.01); *H05K 7/20509* (2013.01)

(58) Field of Classification Search
None
See application file for complete search history.

(56) References Cited

U.S. PATENT DOCUMENTS

| | | | |
|---|---|---|---|
| 2006/0065874 A1* | 3/2006 | Campbell | H05K 7/20772 251/348 |
| 2016/0010772 A1* | 1/2016 | Tiberghien | F16L 25/0018 285/24 |
| 2019/0350118 A1* | 11/2019 | Maro | A01B 59/042 |

* cited by examiner

*Primary Examiner* — Mukundbhai G Patel
(74) *Attorney, Agent, or Firm* — Womble Bond Dickinson (US) LLP (57) ABSTRACT

A cooling arrangement for an electronic rack of a data center having a rack manifold with liquid supply line to receive first cooling liquid from a cooling liquid source and liquid return line to return first warmer liquid back to the cooling liquid source. A plurality of server chassis are arranged in a stack, each server chassis including one or more fluid cooling devices associated with one or more information technology (IT) components. A plurality of connector modules are attached to the servers, each providing fluid connections between the fluid cooling devices and the cooling liquid source on the racks; wherein each of the connector module comprises a frame having mounts configured for attaching the frame onto the server a plurality of channels formed in the frame to accept the fluid connectors; and, a plurality of fluid connectors slidably mounted in the channels.

18 Claims, 9 Drawing Sheets

ADVANCED FLUID CONNECTION DESIGN FOR MULTIPLE PHASE SYSTEM

FIELD OF THE INVENTION

Embodiments of the present invention relate generally to data center and electronics cooling. More particularly, embodiments of the invention relate to modular fluid connection and hardware design particularly beneficial for multiple phase systems.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

The servers and different types of IT equipment, which can be understood as different compute, storage and other functions based systems include multiple connectors are provided in the rear to deliver electrical communication, power, cooling fluids, etc. Such connectors may be blind mate connectors, wherein the male-female connection is done blindly by self-alignment of the mating connectors, such that a user need not reach the back of the unit to connect or disconnect the various connectors. To enable such blind connections, the connectors must be located at a fixed orientation to accept the mating connection. However, with the incorporation of advanced multi-phase cooling systems, different systems may require different arrangement for the fluid connectors, thus exacerbating the design of fluid cooling connections.

The interoperability of different cooling elements is important to accommodate different rack configurations, fluid systems and rack level fluid port availabilities in actual uses.

BRIEF DESCRIPTION OF THE DRAWINGS

Embodiments of the invention are illustrated by way of example and not limitation in the figures of the accompanying drawings in which like references indicate similar elements.

FIG. 4A is a general schematic illustrating a connector module according to an embodiment, while

FIG. 5A is a general schematic illustrating a connector module 500 according to an embodiment, while

FIG. 6A is a general schematic illustrating a connector module 600 according to an embodiment, while

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Disclosed embodiments provide a flexible interface for connectors in a computing system, especially suitable for blind mate fluid connectors in systems that may use multiple phase fluid cooling. In such systems fluid flow may rely on gravity and/or fluid pressure, such that the locations of the connectors may differ for each supply and return lines of each FRU within the enclosure. Disclosed embodiments introduce an interface that enables to easily rearrange the location of the blind mate connectors for the fluids.

In disclosed embodiments the interface comprises a frame mountable onto the computing enclosure and having a plurality of channels or tracks. Each channel may slidably accept one or more connectors, such that the connector may slide within the channel to different positions within the channel. Preset positions may be configured for each channel, such that each connector may be slide to one of the preset position. Each pair of connectors may be interconnected such that they move in unison, so as to maintain a fixed spatial orientation there-between. Thus, moving one connector would force the paired connector to move as well to maintain the spatial orientation.

In one aspect, a connector module for electronic rack includes a frame having mounts configured for attaching the frame onto the electronic rack, a plurality of channels formed in the frame to accept fluid connectors, and a plurality of fluid connectors slidably mounted in the channels. The connector module further includes an interconnector attached to at least two fluid connectors thereby maintaining fixed spatial orientation between the two fluid connectors. Each of the fluid connector further comprises a locking mechanism affixing the fluid connector in a fixed location within the channel. The locking mechanism comprises tight fit of the fluid connector within the channel imparting motion resistance of the fluid connector within the channel preventing free slide. The locking mechanism includes arms extending from the fluid connector and engaging teeth within the channel. The frame further includes a plurality of locators positioned at preset locations and configured for locking the fluid connectors at the preset locations. Each of the fluid connector includes an interconnect kit configured for interconnecting each of the fluid connector to another fluid connector to maintain fixed spatial orientation.

According to another aspect, an electronic rack includes a rack manifold having a rack liquid supply line to receive first cooling liquid from a cooling liquid source and a rack liquid return line to return first warmer liquid back to the cooling liquid source; a plurality of server chassis arranged in a stack, each server chassis including one or more fluid cooling devices associated with one or more information technology (IT) components; and a plurality of connector modules attached to the electronic rack, each providing fluid connections between the fluid cooling devices and the cooling liquid source. Each connector module includes components as described above.

According to a further aspect, a method for providing cooling fluid to an electronic rack of a plurality of server chassis includes mounting a plurality of connector modules to the electronic rack, each connector module provided with at least two channels; attaching a plurality of fluid connectors to the connector modules by attaching at least one fluid connector in each of the channels; and for each of the server chassis, verifying spatial orientation of inlet connector and outlet connector and sliding two of the plurality of connectors to match the spatial orientation of the inlet connector and outlet connector, and securing the two connectors in the spatial orientation, and then mounting the server chassis in the electronic rack by engaging the two connectors with the inlet connector and outlet connector.

The securing the two connectors comprises positioning the two connectors in selected predefined dedicated locations identified by pre-arranged locators applied to the channels. The method further includes mounting a multi-device chassis having multiple cooling devices by engaging the multi-device chassis with multiple pairs of fluid connectors. The method further includes, for each pair of fluid connectors, affixing a riser connector at higher elevation than a return connector.

The following disclosure starts by providing background information regarding the application of the disclosed embodiments, and then proceeds to disclose specific embodiments. In this context, the embodiments may refer simply to connectors, and such reference is intended to include blind mate fluid connectors, including such connectors that may be engaged and disengaged without fluid leaks. Such connectors may include a valve that closes when a mating connector is disconnected, so as to prevent fluid from leaking.

Figure 1:
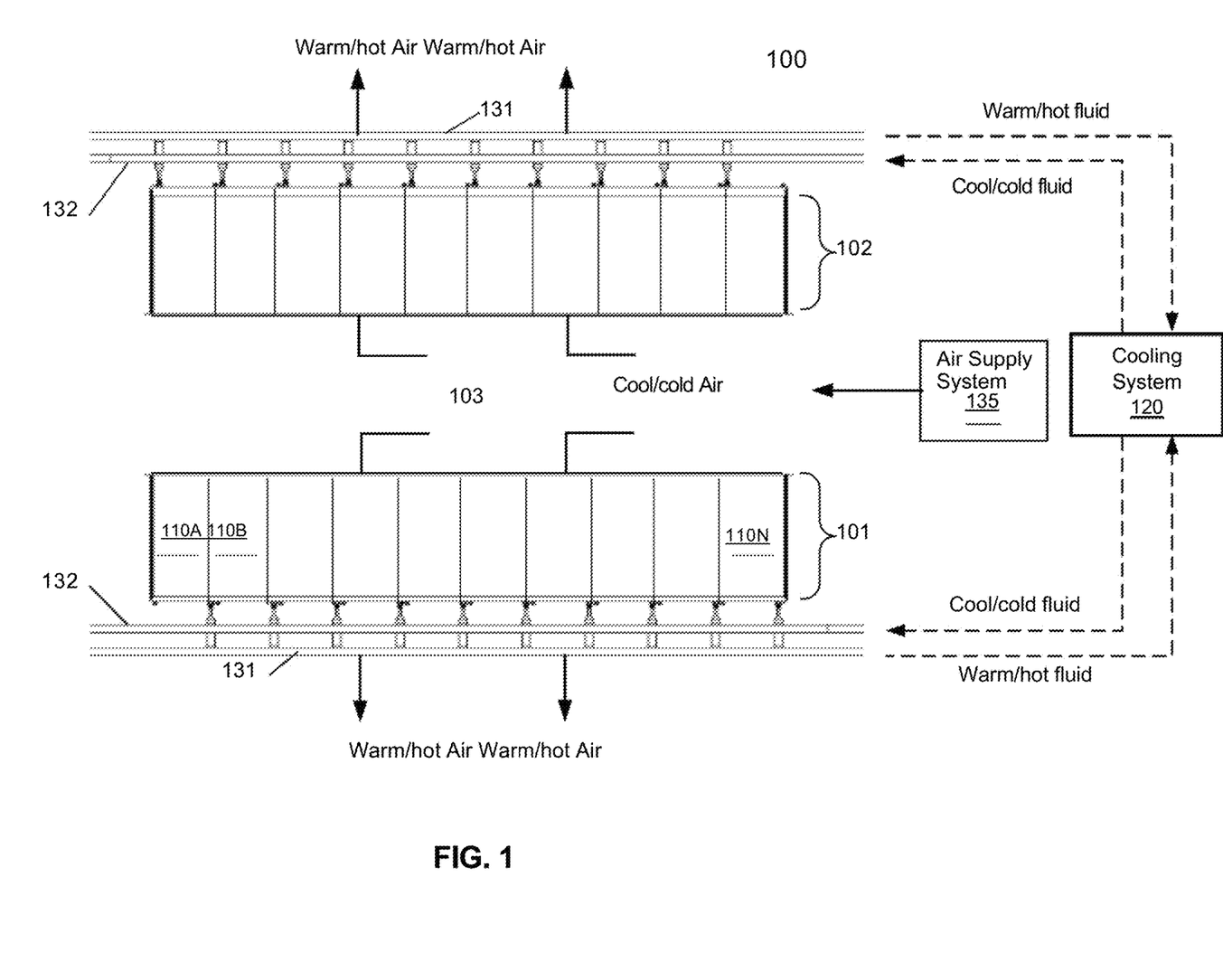
FIG. 1 is a block diagram illustrating an example of a data center facility according to one embodiment.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes one or more rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied. For example, two rows of electronic racks may back to back face each other without forming an aisle in between, while their frontends face away from each other. The backends of the electronic racks may be coupled to the room cooling liquid manifolds.

In one embodiment, each of the electronic racks (e.g., electronic racks 110A-110N) includes a housing to house a number of IT components arranged in a stack operating therein. The electronic racks can include a cooling liquid manifold, a number of server slots (e.g., standard shelves or chassis configured with an identical or similar form factor), and a number of server chassis (also referred to as server blades or server shelves) capable of being inserted into and removed from the server slots. Each server chassis represents a computing node having one or more processors, a memory, and/or a persistent storage device (e.g., hard disk), where a computing node may include one or more servers operating therein. At least one of the processors is attached to a liquid cold plate (also referred to as a cold plate assembly) to receive cooling liquid. In addition, one or more optional cooling fans are associated with the server chassis to provide air cooling to the computing nodes contained therein. Note that the cooling system 120 may be coupled to multiple data center systems such as data center system 100.

In one embodiment, cooling system 120 includes an external liquid loop connected to a cooling tower or a dry cooler external to the building/housing container. The cooling system 120 can include, but is not limited to evaporative cooling, free air, rejection to large thermal mass, and waste heat recovery designs. Cooling system 120 may include or be coupled to a cooling liquid source that provide cooling liquid.

In one embodiment, each server chassis is coupled to the cooling liquid manifold modularly, such that a server chassis can be removed from the electronic rack without affecting the operations of remaining server chassis in the electronic rack and the cooling liquid manifold. In another embodiment, each server chassis is coupled to the cooling liquid manifold through a quick-release coupling assembly having a server liquid intake connector and a server liquid outlet connector coupled to a flexible hose to distribute the cooling liquid to the processors. The server liquid intake connector is to receive cooling liquid via a rack liquid intake connector from a cooling liquid manifold mounted on a backend of the electronic rack. The server liquid outlet connector is to emit warmer or hotter liquid carrying the heat exchanged from the processors to the cooling liquid manifold via a rack liquid outlet connector and then back to a coolant distribution unit (CDU) within the electronic rack.

In one embodiment, the cooling liquid manifold disposed on the backend of each electronic rack is coupled to liquid supply line 132 (also referred to as a room supply manifold) to receive cooling liquid from cooling system 120. The cooling liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 (also referred to as a room return manifold) back to cooling system 120.

Liquid supply/return lines 131-132 are referred to as data center or room liquid supply/return lines (e.g., global liquid supply/return lines), which supply cooling liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server chassis in the electronic rack to deliver the cooling liquid to the cold plates of the processors.

In one embodiment, data center system 100 further includes an optional airflow delivery system 135 to generate an airflow to cause the airflow to travel through the air space of the server chassis of the electronic racks to exchange heat generated by the computing nodes due to operations of the computing nodes (e.g., servers) and to exhaust the airflow exchanged heat to an external environment or a cooling system (e.g., air-to-liquid heat exchanger) to reduce the temperature of the airflow. For example, air supply system 135 generates an airflow of cool/cold air to circulate from aisle 103 through electronic racks 110A-110N to carry away exchanged heat.

The cool airflows enter the electronic racks through their frontends and the warm/hot airflows exit the electronic racks from their backends. The warm/hot air with exchanged heat is exhausted from room/building or cooled using a separate cooling system such as an air-to-liquid heat exchanger. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling. Moreover, the liquid cooling may be multi-phase system wherein fluid flows in liquid or gaseous phase.

Figure 2:
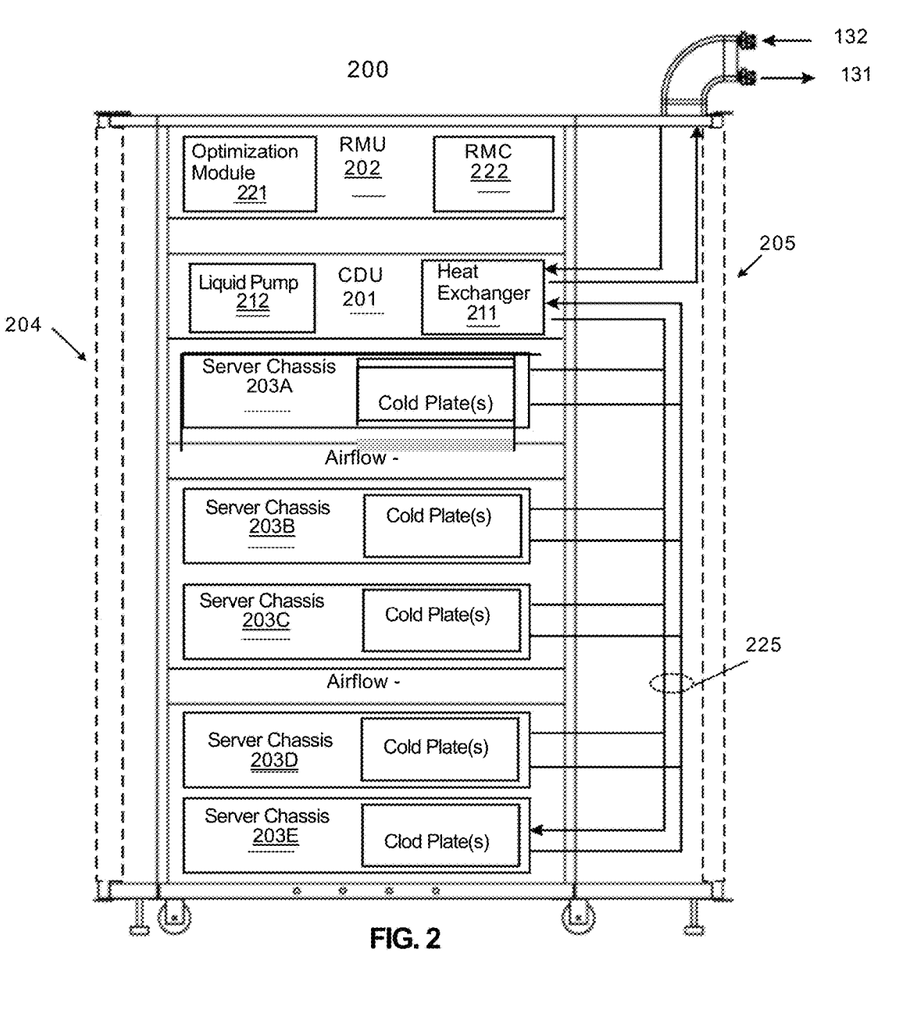
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, rack management unit (RMU) 202, and one or more server chassis 203A-203E (collectively referred to as server chassis 203). Server chassis 203 can be inserted into an array of server slots (e.g., standard shelves) respectively from frontend 204 or backend 205 of electronic rack 200. Note that although there are five server chassis 203A-203E shown here, more or fewer server chassis may be maintained within electronic rack 200. Also note that the particular positions of CDU 201, RMU 202, and/or server chassis 203 are shown for the purpose of illustration only; other arrangements or configurations of CDU 201, RMU 202, and/or server chassis 203 may also be implemented. In one embodiment, electronic rack 200 can be either open to the environment or partially contained by a rack container, as long as the cooling fans can generate airflows from the frontend to the backend.

In addition, for at least some of the server chassis 203, an optional fan module (not shown) is associated with the server chassis. Each of the fan modules includes one or more cooling fans. The fan modules may be mounted on the backends of server chassis 203 or on the electronic rack to generate airflows flowing from frontend 204, traveling through the air space of the sever chassis 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid or multi-phase heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, may be coupled to cooling system 120 as described above.

In addition, heat exchanger 211 further includes a second loop with two ports having a second pair of liquid connectors coupled to liquid manifold 225 (also referred to as a rack manifold) to form a secondary loop, which may include a supply manifold (also referred to as a rack liquid supply line or rack supply manifold) to supply cooling liquid to server chassis 203 and a return manifold (also referred to as a rack liquid return line or rack return manifold) to return warmer liquid back to CDU 201. Note that CDUs 201 can be any kind of CDUs commercially available or customized ones. Thus, the details of CDUs 201 will not be described herein.

Each of server chassis 203 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 200 further includes optional RMU 202 configured to provide and manage power supplied to servers 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and the fan modules. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by the fan modules and liquid pump 212, which may be proportional to their respective speeds. These operating data are referred to as real-time operating data. Note that the monitor may be implemented as a separate module within RMU 202.

Based on the operating data, optimization module 221 performs an optimization using a predetermined optimization function or optimization model to derive a set of optimal fan speeds for the fan modules and an optimal pump speed for liquid pump 212, such that the total power consumption of liquid pump 212 and the fan modules reaches minimum, while the operating data associated with liquid pump 212 and cooling fans of the fan modules are within their respective designed specifications. Once the optimal pump speed and optimal fan speeds have been determined, RMC 222 configures liquid pump 212 and cooling fans of the fan modules based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server chassis 203. Similarly, based on the optimal fan speeds, RMC 222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown in FIG. 2 is shown and described for the purpose of illustration only; other configurations or arrangements may also be applicable. For example, CDU 201 may be an optional unit. The cold plates of server chassis 203 may be coupled to a rack manifold, which may be directly coupled to room manifolds 131-132 without using a CDU. Although not shown, a power supply unit may be disposed within electronic rack 200. The power supply unit may be implemented as a standard chassis identical or similar to a sever chassis, where the power supply chassis can be inserted into any of the standard shelves, replacing any of server chassis 203. In addition, the power supply chassis may further include a battery backup unit (BBU) to provide battery power to server chassis 203 when the main power is unavailable. The BBU may include one or more battery packages and each battery package include one or more battery cells, as well as the necessary charging and discharging circuits for charging and discharging the battery cells.

Figure 3:
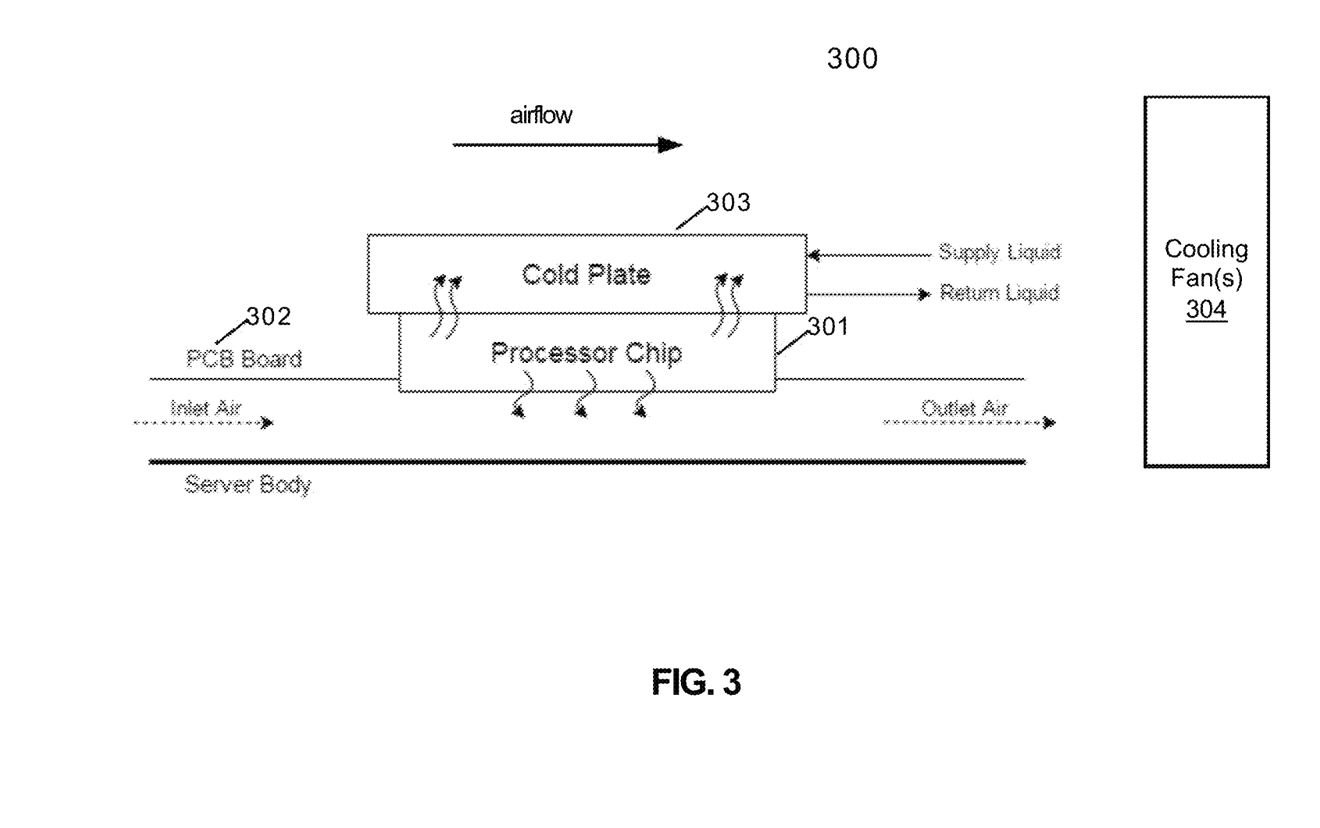
FIG. 3 is a block diagram illustrating an example of a cold plate configuration according to one embodiment.

FIG. 3 is a block diagram illustrating a processor cold plate configuration according to one embodiment. The processor/cold plate assembly 300 can represent any of the processors/cold plate structures of server chassis 203 as shown in FIG. 2. Referring to FIG. 3, processor 301 is plugged onto a processor socket mounted on printed circuit board (PCB) or motherboard 302 coupled to other electrical components or circuits of a data processing system or server. Processor 301 also includes a cold plate 303 attached to it, which is coupled to a rack manifold that is coupled to liquid supply line 132 and/or liquid return line 131 e.g., via blind mate connectors. A portion of the heat generated by processor 301 is removed by the cooling liquid via cold plate 303. The remaining portion of the heat enters into an air space underneath or above, which may be removed by an airflow generated by cooling fan 304.

The rack fluid distribution system may be equipped with different types of connectors, positioned at different locations and/or at different spacing and orientations, including different integration locations such as parallel or staggered. This may increase the difficulty for implementing liquid cooled server on the rack, especially when accounting to multi-phase cooling arrangements. Therefore, disclosed embodiments introduce an adapter design, which may be used for adapting different server systems on different rack fluid distribution hardware designs. The various embodiments enable each configuration of blind mate connectors for different connection requirements of the computing systems.

A beneficial feature of disclosed embodiments is that since the connectors are movable to different locations, the rack side may not need to integrate with many connectors. Since the fluid connectors on the server side can be moved to provide different fluid connection design, a smaller number of connectors are required, thereby providing for cost reduction.

In addition, the different types of servers may require different fluid systems for thermal management. Disclosed embodiments of the connector adapter helps satisfy these different requirements. Similarly, the rack configurations may be different for different IT equipment and systems. The rack level distribution may be designed in different manners, and/or the rack level fluid ports may be in different availabilities, especially when servers are already populated in the rack thus occupying some ports. The individual servers may have different cooling modules designed and implemented for them. Therefore, the fluid flowing directions may be different and the difference in the fluid flowing direction, e.g., using thermosiphon, may generate different performances. Disclosed embodiments enable to easily change the locations of fluid inlet and outlet based on different cooling module designs and the rack liquid systems.

In the following, embodiments for fluid connection module, especially beneficial for multi-phase cooling systems or heterogeneous racks, are disclosed. The connection module may function as an interface for multiple blind mate fluid connectors, wherein internal channels or tracks enable adjusting the position of the connectors. The entire unit can be an integrated unit on a server chassis or a separate unit easily installed or disassembled from the server chassis. The connectors are interconnected in an embodiment for blind mating applications and the internal channels are also being slidable for adjusting the locations of the connectors. The flexible design ensures matching with different rack level design specifications. In an embodiment, the connection module may have two types of channels, one for the connectors and the other one for the internal connection (intra-connection) of the connectors. The variation in locations of the channels as well as the connectors can be used for assembling different cooling fluid operating requirements, either single phase or two phase fluid.

The ability to slide the fluid connectors within the channels enable further advantages in various use cases. For example, the rack ports may be occupied by other systems on an existing rack, so the solution enables more possibilities to utilize different rack ports which are available as well as adjusting other systems connections to enable new system installation. Also, the variation in the internal channel allows for integrating multiple sets of connectors and sub-loops from a server chassis.

Figure 4A:
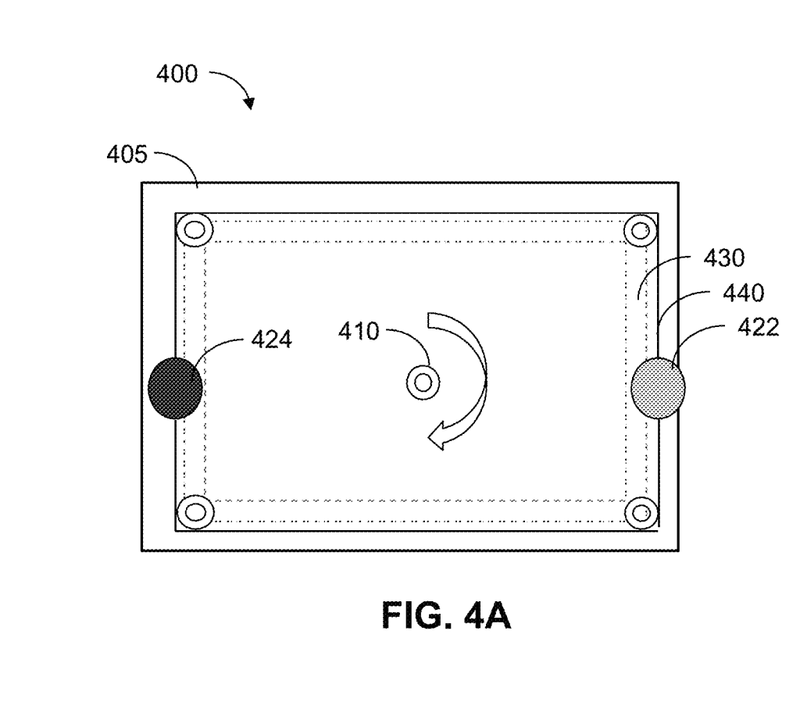
Figure 4B:
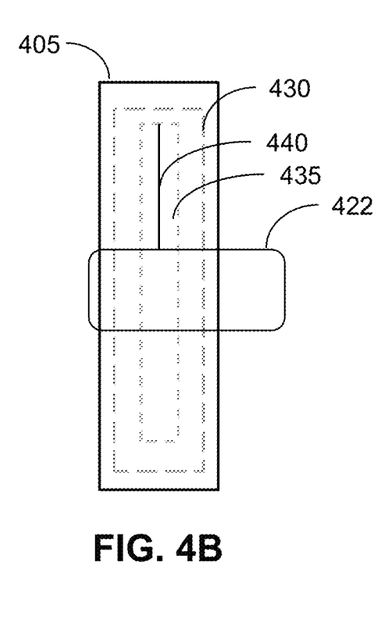
FIG. 4B is a side view thereof.

FIG. 4A is a general schematic illustrating a connector module 400 according to an embodiment, while FIG. 4B is a side view thereof. The connector module 400 forms a housing or frame 405 having mounting points 410 for mounting the housing 405 to the servers. In this embodiment the mounting point 410 is provided in the middle of the connector module, so as to enable rotation of the module, as illustrated by the curved arrow, to be placed in different orientations as needed.

Connectors 422 and 424 are slidably mounted onto the housing 405. In this embodiment, connectors 422 and 424 are paired, in that one serves as intake and one as return for one liquid cooling element. Each of connectors 422 and 424 may slide in channel or track 430 so as to change its position in the housing 405. In one example, the channel 430 is formed to have tight fit to the connectors, such that the connectors may slide by application of force, but once placed in one position they remain in that position. In this sense, tight fit means that the connectors do not slide by force of gravity, but requires an additional application of force to change elevation. In such embodiment, no mechanical locking mechanism is needed to secure the connectors in a given position, albeit a locking mechanism may be used in other embodiments if desired.

Also, in order to easily blind mate to corresponding connectors, e.g., of a serve chassis, the relative orientation of the paired connectors 422 and 424 is maintained by use of an interconnection 440. The interconnection 440 ensures that the paired connectors 422 and 424 are maintained in relative orientation that conforms to standard rack configuration. This feature ensures that blind mating can be easily accomplished.

In disclosed embodiments the interconnection of the paired connectors also assists the locking of the two connectors, preventing any unintentional motion, e.g., from gravity. In one embodiment, during the blind mating procedure, different directions of forces may be loaded on the connectors 424 and 422 when mating with the corresponding connectors on the rack level fluid distribution. The interconnection also functions as additional protection.

FIG. 4B illustrates a side view of the embodiment of FIG. 4A, showing the connector 422, which can be positioned in different positions along channel 430. Also shown is interconnection 440, which resides in and may slide within secondary channel 435 and connects to a paired connector. In this way, when connector 422 is moved, connector 424 moves with it to maintain the distance between the paired connectors constant.

In one embodiment, the two channels maybe merged to one, while two dedicated channels may provide additional structure enhancement.

Figure 5A:
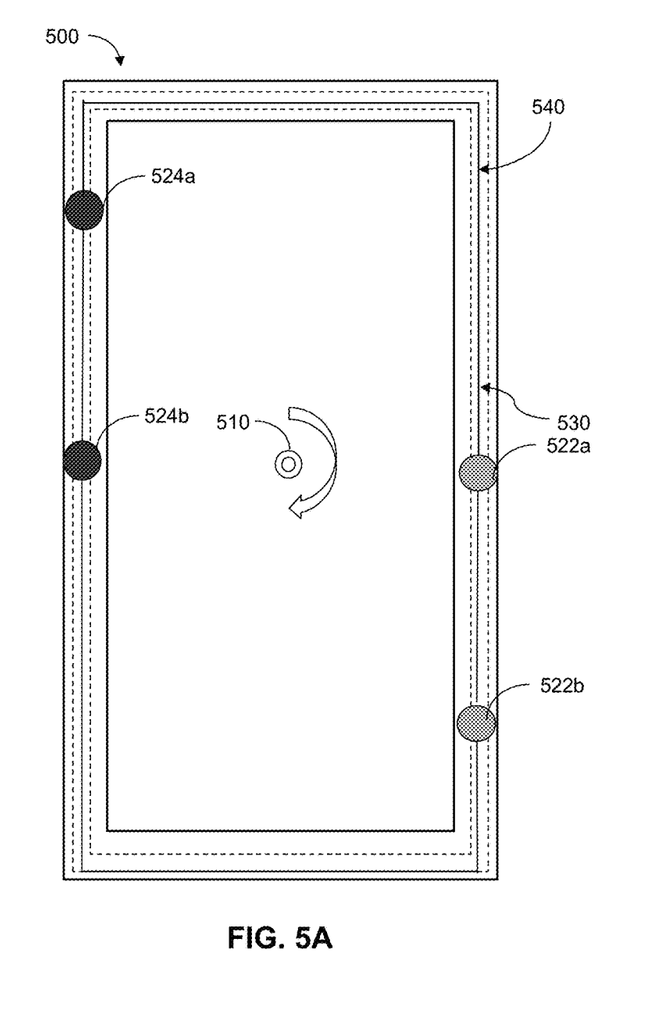
Figure 5B:
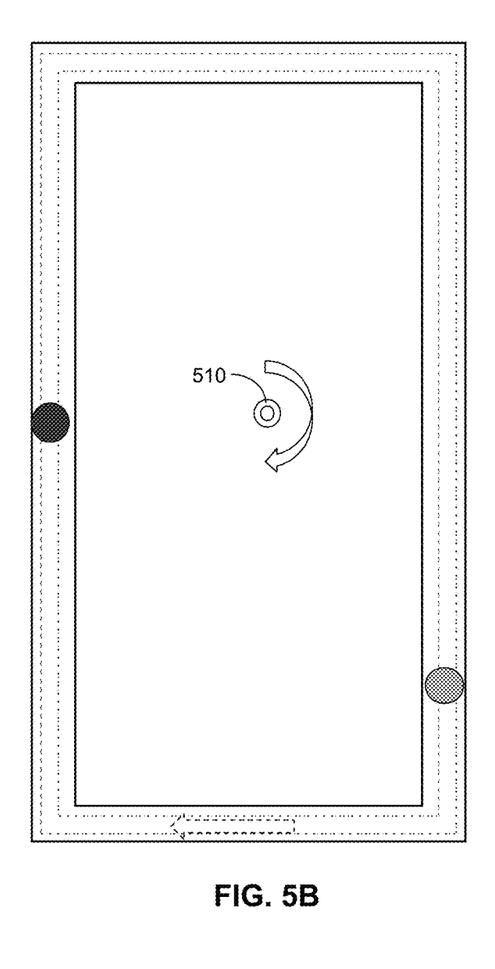
FIG. 5B is a general schematic illustrating another embodiment without interconnection.

FIG. 5A is a general schematic illustrating a connector module 500 according to an embodiment, while FIG. 5B is a general schematic illustrating another embodiment without interconnection. FIG. 5A illustrates an embodiment wherein multiple pairs of connectors are mounted within the channel 530. As shown in this example, connectors 522a and 524a are paired, and connectors 522b and 524b are paired. Interconnections 540 are provided between the connectors of each of the pairs, and between the two pairs, such that the distance between each two connectors remain fixed regardless of the position it is placed in within the channel 530. Thus, while in this embodiment the connectors are movable inside the channel 530, the distance between one inlet connector and another inlet connector is fixed, the distance between one return connector and another return connector is fixed, and the distance between one inlet connector and its paired return connector is fixed, all according to the rack configuration.

FIG. 5B, on the other hand, illustrates an embodiment wherein no interconnections are provided between the connectors, since the connectors are fixed within a track that is movable in the channel. Since the connectors are affixed to the movable track, as the track moves the distance between the connectors remains the same, thus achieving the same function as in FIG. 5A. That is, the movable track function to both move the connectors to different position and as the interconnection between the connectors. The tracks may move within the channel 530.

Figure 6A:
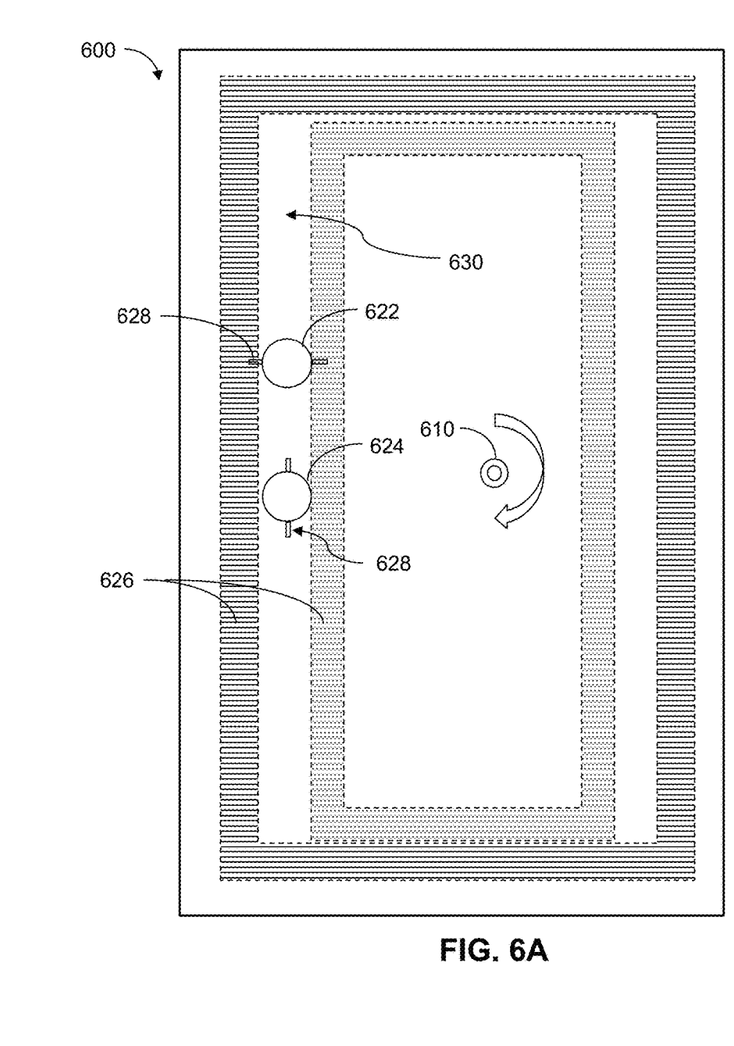
Figure 6B:
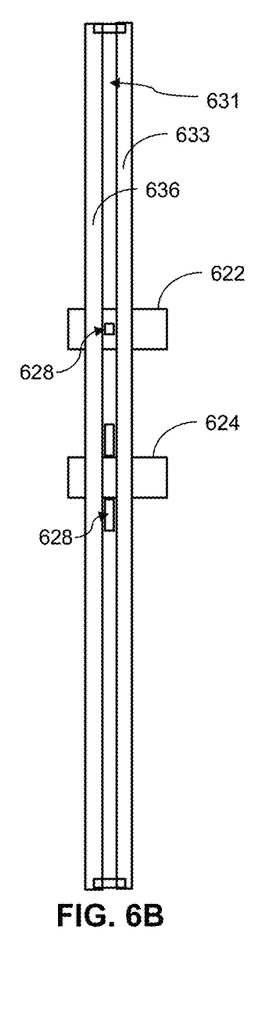
FIG. 6B is a general side-view schematic of the module and FIG. 6C is a side view illustrating one of the connectors shown in FIG. 6A.
Figure 6C:
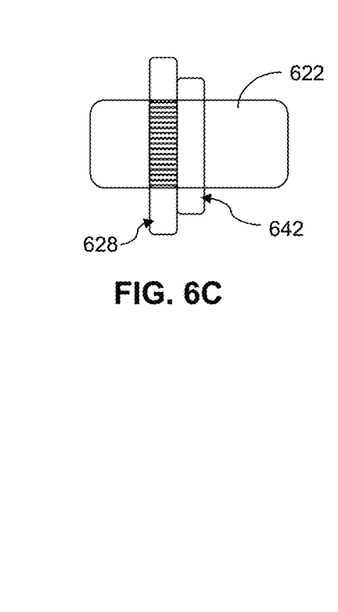

FIG. 6A is a general schematic illustrating a connector module 600 according to an embodiment, while FIG. 6B is a general schematic illustrating a side view of the embodiment of FIG. 6A. FIG. 6C illustrates a side view of one of the connectors shown in FIGS. 6A and 6B. As illustrated in FIG. 6A, connectors 622 and 624 may slide within channel 630. In this embodiment, each of the connectors 622 and 624 incorporates engagement arms 628. Engagement arms 628 are designed to engage space 631 formed between two sections 633 and 636 of the module 630. In the illustration, connector 624 is shown in its insertion orientation. Once it is inserted into the channel 630, it is rotated 90 degrees, so that the engagement arms 628 are inserted into space 631, thereby engaged between sections 633 and 636 so as to be mounted within the channel 630. The engaged orientation is illustrated by connector 622.

According to an optional feature, toothed tracks 626 are provided within the space 631, so that when the connector is rotated to an engaging position, illustrated by connector 622, the engagement arms 628 engage the toothed track and affix the connector in its position. Conversely, when the connector is rotated as illustrated by connector 624, the connector is free to slide within channel 630 to be positioned anywhere along the channel 630. As illustrated in FIG. 6B, an interconnection kit 642 may also be fitted to each connector when it is desired to interconnect the connector to maintain relative position of the connectors.

Figure 7A:
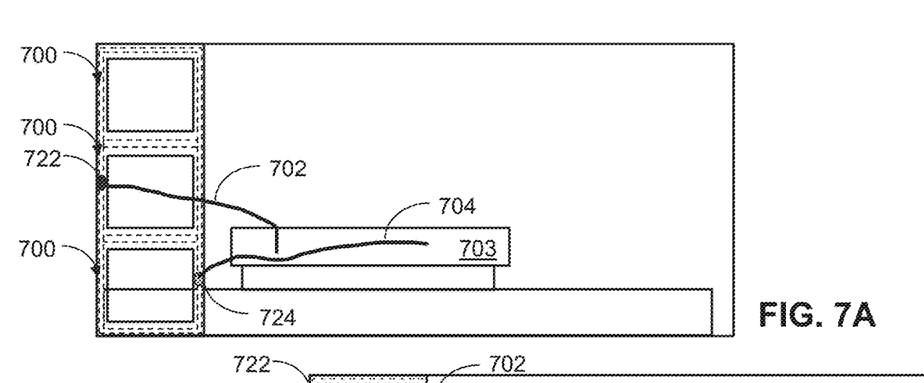
FIGS. 7A-7C illustrates embodiments for server-level integration of the connector module.
Figure 7B:
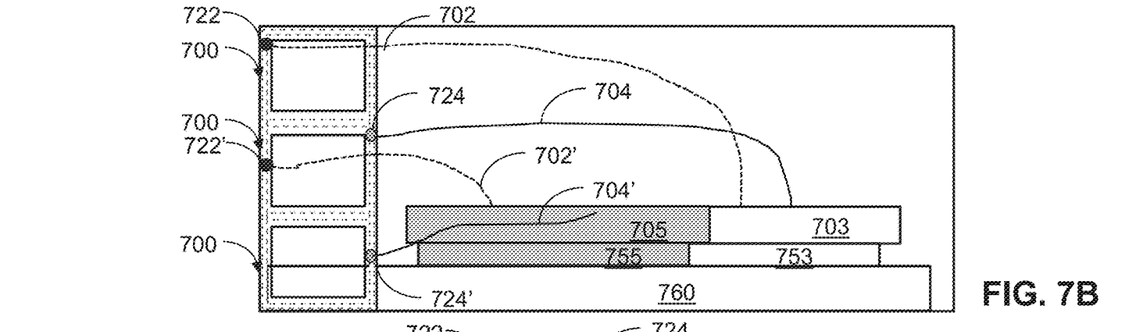
Figure 7C:
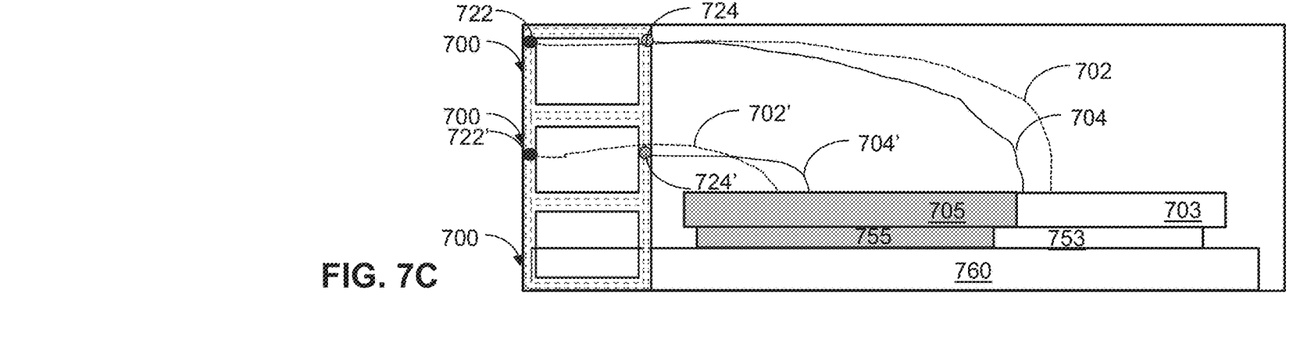

FIGS. 7A-7C illustrates embodiments for server-level integration of the connector module. As illustrated, multiple modules 700 can be attached to the chassis and used to implement various fluid connections, depending on the cooling requirements. The ability to change elevation of each connector becomes especially advantageous when the fluid flow design is assisted by gravity or thermosiphon, for which difference in elevation may create a motive force. For example, in FIG. 7A cooling element 703 may employ phase change cooling, wherein the "hot" line 702 delivers vapor to connector 722, while the return line 704 delivers cooled liquid from connector 724. To assist in the circulation of the fluid, connector 722 is positioned vertically higher than connector 724, conforming to the natural thermosiphon flow.

In the example of FIG. 7B, two microchips 753 and 755 are mounted on the PCB 760. Microchip 755 is cooled by cooling device 705 and microchip 753 is cooled by cooling device 703. Cooling devices 703 and 705 may be the same or different type of cooling devices and may operate using single or multiple phase cooling cycle. Consequently, the lines 702, 704, 702' and 704' may require different blind mate connectors to accommodate different specifications. Therefore, each of the modules 700 is designed to accommodate different types of blind mate connectors and the channel enables positioning these connectors at any orientation, as required by the design of the chassis.

The embodiment illustrated in FIG. 7C is similar to that of FIG. 7B, except that each pair of connectors is fixed at the same vertical elevation. For example, connectors 722 and 724 are at the same vertical elevation and connectors 722' and 724' are at the same vertical elevation. Suh an arrangement would be more useful when the motive force applied to the fluid may include mechanical force, such as a pump.

it should be appreciated that the embodiments illustrated in FIGS. 7A-7C also illustrate the beneficial use of the connector module for different racks' port availabilities. That is, regardless of the type of cooling employed, sometimes when a server is to be installed in a rack, different rack ports configuration may be available, either due to prior equipment being already installed or due to a particular design of the rack. Thus, the connector module can be tailored to mate with the specific ports that are available on the rack.

Figure 8:
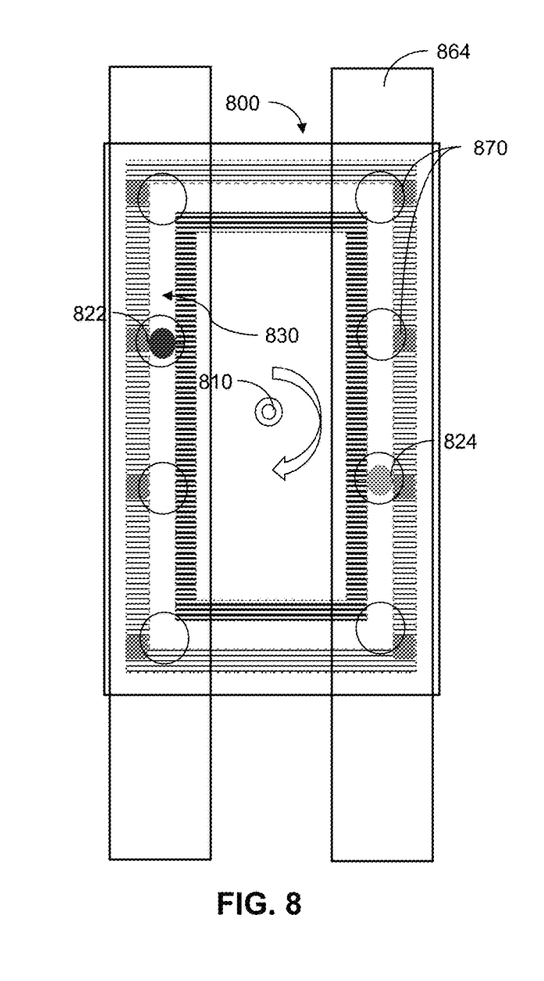
FIG. 8 illustrates an embodiment for a rack level connector module.

FIG. 8 illustrates an embodiment for a rack level connector module 800. The connector module 800 provides cooling fluid connection to the rack manifold 864 in a similar manner as illustrated in the other embodiments. Connectors 822 and 824 can slide within channel 830 to be positioned at any location along the channel 830. Optionally, locators 870 are provided to enable affixing the connectors at predefined dedicated locations that match different port mating scenarios according to the rack manifold design. That is, the locators 870 are placed in elevations that conform to different rack manifold designs and standards. Locators 870 may comprise markings on the frame or may comprise mechanical stops for positioning the connectors in preselected locations within the channels.

FIG. 8 also illustrates how the connector module can be used for different types of racks. For example, the width of the module 800 may be set according to the size of the rack manifold 864. Similarly, the locators can be set according to the spacing of different port arrangements on the rack. Also, as in prior embodiments, the entire module 800 can be rotated about mounting point 810 to fit different port arrangements.

Figure 9:
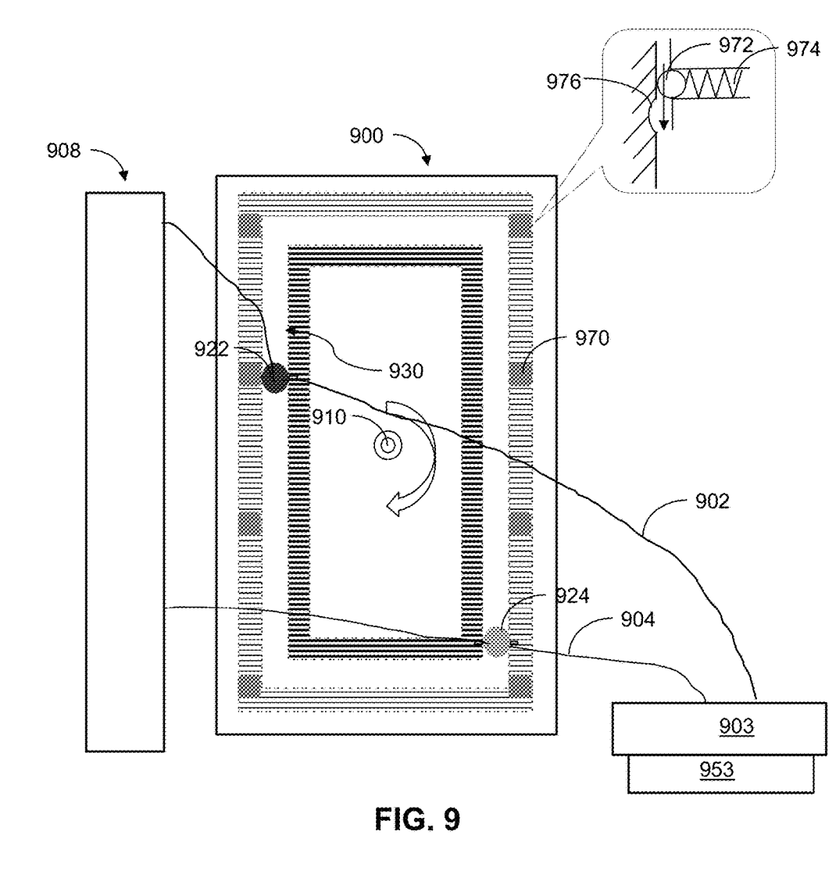
FIG. 9 illustrates an embodiment particularly suitable for implementing closed loop thermosiphon cooling.

FIG. 9 illustrates an embodiment particularly suitable for implementing closed loop thermosiphon cooling. In FIG. 9 the connector module 900 is employed in a dual-phase cooling system wherein it is positioned for connecting a cooling device 903, e.g., an evaporator mounted onto microchip 953, to a heat exchanger 908, e.g., a condenser. The flow of the fluid may be accomplished via thermosiphon, so that line 902 serves as a riser which delivers gaseous fluid to connector 922, which is positioned at a higher vertical position or altitude than the liquid connector 924. Once the gas condenses within the condenser 908 it is returned via the liquid return line 904, which is connected to liquid connector 924 at a lower altitude than gaseous connector 922. Using the connector module 900 the riser connector 922 can be raised to an optimal location to enable hot and high pressure gas to rise, while the liquid connector 924 can be positioned lower to provide gravity assist for the liquid flow optimization. In this manner the connector module 900 enables blind mate connection of the cooling system's lines, while also enhancing the fluid flow within the cooling system.

Incidentally, the callout in FIG. 9 illustrates one simple example for forming the locators 970. In this non-limiting example, the locators are formed as a simple ball and detent mechanism. Ball 972 is urged against the wall of the module 900 by spring 974. When sliding against the flat wall the ball little friction, but the connector can be easily moved. Conversely, when the ball enters detent 976, which is provided in any of the locators positions 970, a mechanical stoppage is generated. This mechanical stoppage can be easily overcome by a user moving the connector, but it prevents the connector from freely sliding by itself, especially due to gravity.

Figure 10:
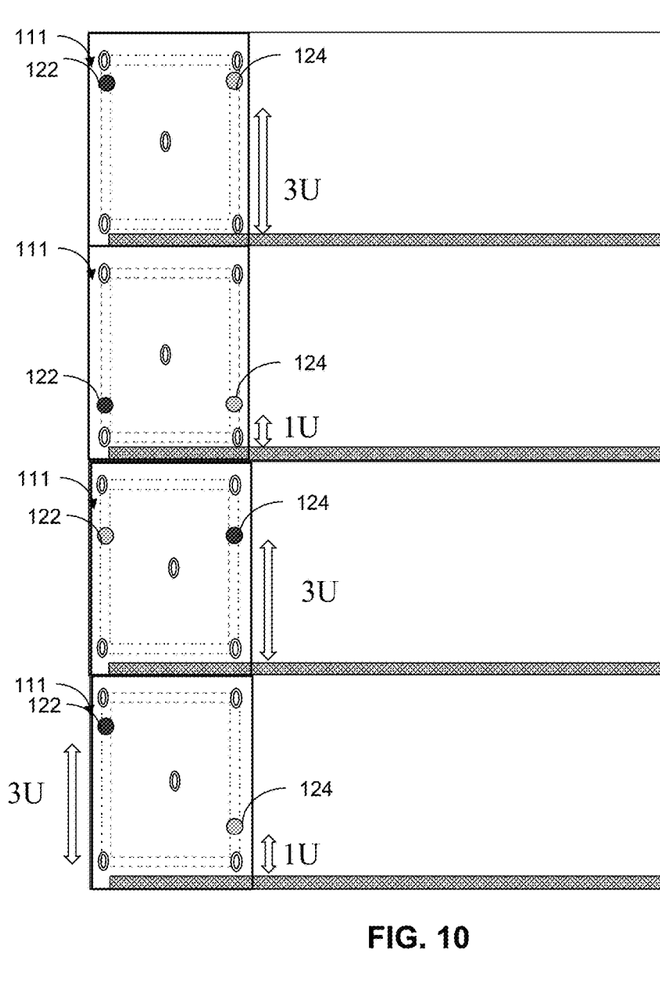
FIG. 10 is a general schematic illustrating embodiments of the connector module employed in a section of heterogeneous computing rack.

FIG. 10 is a general schematic illustrating embodiments of the connector module employed in a heterogeneous computing rack. Standard computing racks are generally designed according to spacing of rack space specifications. This unit of measure typically defines the size of the rack frame and the size of the equipment fitted inside the frame, such that the sizes are expressed in terms of rack units and/or form factors, such as Us. For example, a typical full size rack cage may be of 42U high, and the size of each particular equipment mounted within the rack may typically be of 1U, 2U, 3U or 4U.

A heterogeneous rack would have equipment mounted therein having different U sizes. The embodiment of FIG. 10 illustrates how connector modules can be used to provide different connection arrangements to different units within the rack. Notably, although all of the connector modules 111 have the same design, each enables different connection configuration to accommodate different requirements.

In FIG. 10 the rack is divided into sections of 4U each, although the equipment within each section may be of different size, e.g., two units of 2U within one space, one 1U unit and one 3U units, etc. Since the connectors can slide within the channel of each connector module 111, the height of each connector within its 4U space can be selected to accommodate the equipment mounted within that space. For example, in the bottom space connector 122 is positioned at the 3U height, while connector 124 is positioned at the 1U height. This corresponds to, e.g., the embodiment illustrated in FIG. 9. Conversely, in the second 4U space both connectors 122 and 124 are positioned horizontally aligned at the 3U space, at the third 4U space they are aligned horizontally at the 1U height, and at the top space they are aligned at the 4U height.

Figure 11:
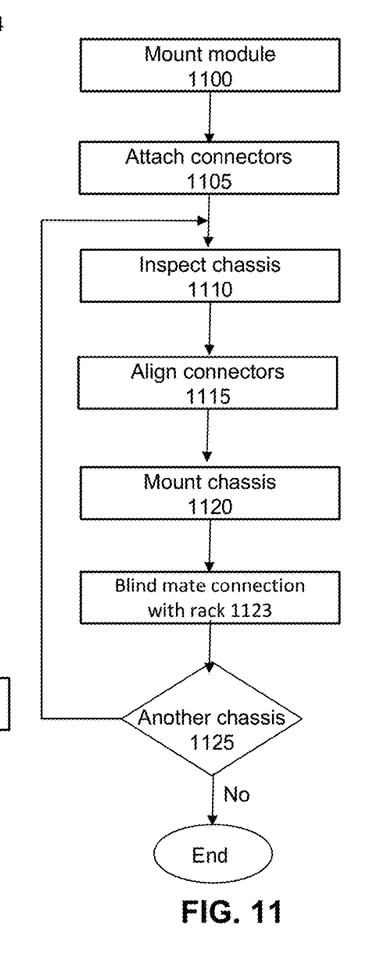
FIG. 11 is a flow chart illustrating a process according to an embodiment.

FIG. 11 is a flow chart illustrating a process according to an embodiment. The process provides fluid connections employing any of the connector modules described herein. In block 1100 a plurality of modules may be mounted onto the electronic rack. Each of the modules has at least two channels. At block 1105 a plurality of fluid connectors are attached to the connector modules, wherein at least one connector is attached to each channel. Then for each chassis to be mounted onto the electronic rack, at block 1110 the chassis is inspected to identify the spatial orientation of the fluid inlet and outlet connectors. Then, at block 1115 the connectors in at least two channels are slid to align them to the spatial orientation of the inlet and outlet connectors of the chassis. In block 1120 the chassis is mounted by engaging the inlet and outlet connectors to the fluid connectors of the connector module. In this case, it is desired that the connectors are of the blind mate type, thus FIG. 11 includes block 1123 for blind mate connection with the rack. If in block 1125 it is determined that there are more chassis to mount, the process reverts to block 1110. Otherwise, the process ends.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A connector module for an electronic rack, comprising:
   a frame having mounts configured for attaching the frame onto the electronic rack;

a plurality of channels formed in the frame to accept fluid connectors; and a plurality of fluid connectors slidably mounted in the channels; and, wherein each of the fluid connectors further comprises a locking mechanism affixing the fluid connector in a fixed location within the channel.

2. The module of claim 1, further comprising an interconnector attached to at least two fluid connectors thereby maintaining fixed spatial orientation between the two fluid connectors.

3. The module of claim 1, wherein the locking mechanism comprises tight fit of the fluid connector within a channel imparting motion resistance of the fluid connector within a channel preventing free slide.

4. The module of claim 1, wherein the locking mechanism comprises arms extending from the fluid connector and engaging teeth within the channel.

5. The module of claim 1, wherein the frame further comprises a plurality of locators positioned at preset locations and configured for locking the fluid connectors at the preset locations.

6. The module of claim 1 wherein each of the fluid connectors comprises an interconnect kit configured for interconnecting each of the fluid connector to another fluid connector to maintain fixed spatial orientation.

7. An electronic rack of a data center, comprising:

a rack manifold having a rack liquid supply line to receive first cooling liquid from a cooling liquid source and a rack liquid return line to return first warmer liquid back to the cooling liquid source;

a plurality of server chassis arranged in a stack, each server chassis including one or more fluid cooling devices associated with one or more information technology (IT) components; and a plurality of connector modules attached to the electronic rack, each providing fluid connections between the fluid cooling devices and the cooling liquid source; wherein each of the connector module comprises:

a frame having mounts configured for attaching the frame onto the electronic rack, a plurality of channels formed in the frame to accept the fluid connectors, and a plurality of fluid connectors slidably mounted in the channels; and a plurality of interconnectors, each attached to at least two fluid connectors thereby maintaining fixed spatial orientation between the two fluid connectors.

8. The electronic rack of claim 7, wherein the fluid cooling devices are selected from cooling plates and condensers.

9. The electronic rack of claim 7, wherein at least one of the fluid cooling device comprises a riser gas line and a liquid return line, and wherein the riser gas line is connected to a connector mounted on a first connector module and the liquid return line is connected to a connector mounted on a second connector module, wherein the first connector module is mounted vertically higher than the second connector module.

10. The electronic rack of claim 7, wherein at least one of the fluid cooling devices comprises a hot liquid line and a cold liquid line, and wherein the hot liquid line is connected to a first connector mounted on a first channel and the cold liquid line is connected to a second connector mounted on a second channel, wherein the first connector is mounted at same vertical height as the second connector.

11. The electronic rack of claim 7, wherein the plurality of fluid connectors comprises a plurality of paired inlet and return connectors, wherein a subset of the paired inlet and return connectors are mounted at same vertical height and remainder of the paired inlet connectors are mounted with the inlet at a higher vertical height than the return connector.

12. The electronic rack of claim 7, wherein each of the fluid connectors further comprises a locking mechanism affixing the fluid connector in a fixed location within the channel.

13. The electronic rack of claim 12, wherein the locking mechanism comprises one of: a tight fit of the fluid connector within a channel imparting motion resistance of the fluid connector within a channel preventing free slide; or arms extending from the fluid connector and engaging teeth within the channel.

14. The electronic rack of claim 7, wherein the frame further comprises a plurality of locators positioned at preset locations and configured for locking the fluid connectors at the preset locations.

15. A method for providing cooling fluid to an electronic rack of a plurality of server chassis, comprising:

mounting a frame with a plurality of connector modules to the electronic rack using mounts, each connector module provided with at least two channels;

attaching a plurality of fluid connectors to the connector modules by attaching at least one fluid connector in each of the channels; and for each of the server chassis, verifying spatial orientation of inlet connector and outlet connector and sliding two of the plurality of connectors to match the spatial orientation of the inlet connector and outlet connector, and securing the two connectors in the spatial orientation using a locking mechanism, and then mounting the server chassis in the electronic rack by engaging the two connectors with the inlet connector and outlet connector.

16. The method of claim 15, wherein securing the two connectors comprises positioning the two connectors in selected predefined dedicated locations identified by pre-arranged locators applied to the channels.

17. The method of claim 15, further comprising mounting a multi-device chassis having multiple cooling devices by engaging the multi-device chassis with multiple pairs of fluid connectors.

18. The method of claim 17, wherein for each pair of fluid connectors, affixing a riser connector at higher elevation than a return connector.

* * * * *